United States Patent
Michna et al.

(10) Patent No.: US 10,881,017 B2
(45) Date of Patent: Dec. 29, 2020

(54) BACKPLANE KEYING MECHANISM

(71) Applicant: Hewlett Packard Enterprise Development LP, Houston, TX (US)

(72) Inventors: Vincent W. Michna, Houston, TX (US); Nilashis Dey, Houston, TX (US); Charles Cornwell, Houston, TX (US); David Chialastri, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/139,261

(22) Filed: Sep. 24, 2018

(65) Prior Publication Data

US 2020/0100380 A1    Mar. 26, 2020

(51) Int. Cl.
| | | |
|---|---|---|
| *H05K 7/14* | (2006.01) | |
| *G06F 3/02* | (2006.01) | |
| *H01H 13/86* | (2006.01) | |

(52) U.S. Cl.
CPC ......... *H05K 7/1452* (2013.01); *G06F 3/0202* (2013.01); *H01H 13/86* (2013.01); *H05K 7/1488* (2013.01)

(58) Field of Classification Search
CPC ..... H05K 7/1452; H05K 7/1488; H01H 13/86
See application file for complete search history.

(56) References Cited

U.S. PATENT DOCUMENTS

| | | | | |
|---|---|---|---|---|
| 5,805,903 A | * | 9/1998 | Elkhoury | G06F 13/409 713/300 |
| 6,771,514 B1 | * | 8/2004 | Elg | H05K 7/1452 361/786 |
| 7,227,756 B2 | | 6/2007 | Gagnon et al. | |
| 8,009,438 B2 | | 8/2011 | Leigh et al. | |
| 8,149,586 B2 | * | 4/2012 | Curnalia | H05K 7/1455 361/726 |
| 8,608,493 B2 | * | 12/2013 | Cowles | H01R 13/645 439/138 |
| 10,205,536 B2 | * | 2/2019 | Leigh | H04B 10/808 |
| 10,653,029 B2 | * | 5/2020 | Schulze | H05K 7/1424 |
| 2002/0111078 A1 | | 8/2002 | Sevier et al. | |
| 2006/0067042 A1 | * | 3/2006 | Salinas | G11B 33/124 361/679.37 |

(Continued)

OTHER PUBLICATIONS

Select a Terminal Base Assembly, pp. 1-3, Retrieved from the Internet on Jul. 19, 2018 from URL<cdn2.rexelusa.com/medias/sys_Rexelusa/sheets/sheets/h0f/hf8/9177219530782/Allen-Bradley-1734-TB3S.pdf>.

*Primary Examiner* — Nathan Milakovich
(74) *Attorney, Agent, or Firm* — Hewlett Packard Enterprise Patent Department

(57) ABSTRACT

Examples described herein include a backplane keying mechanism. The backplane keying mechanism may include a backplane, a first connector, a second connector, a first block for the first connector, and a second block for the second connector. The first block and the second block may be moveable as one unit on the backplane from a first state to a second state. In the first state, the first block allows the first connect to connect to a first type of device and the second block allows the second connector to connect to the first type of device. In the second state, the first block prohibits the first connector from connecting to the first type of device and the second block prohibits the second connector from connecting to the first type of device.

13 Claims, 5 Drawing Sheets

(56) References Cited

U.S. PATENT DOCUMENTS

2006/0232134 A1* 10/2006 Kirkorian ............ H05K 7/1457
307/38
2011/0256753 A1   10/2011 Gulla
2019/0239376 A1*  8/2019 Su ....................... G06F 13/4022
2020/0100380 A1*  3/2020 Michna ................ H05K 7/1452

* cited by examiner

BACKPLANE KEYING MECHANISM

BACKGROUND

Data centers may include chassis to hold multiple computing devices, such as servers, switches, etc. in horizontally or vertically stacked orientations. The chassis may include a backplane that allows the computing devices in the chassis to electrically connect to each other and/or a common power source. The backplane may include electrical connectors that allow the computing devices to plug in.

BRIEF DESCRIPTION OF THE DRAWINGS

The following detailed description references the drawings, wherein.

DETAILED DESCRIPTION

Figure 1:
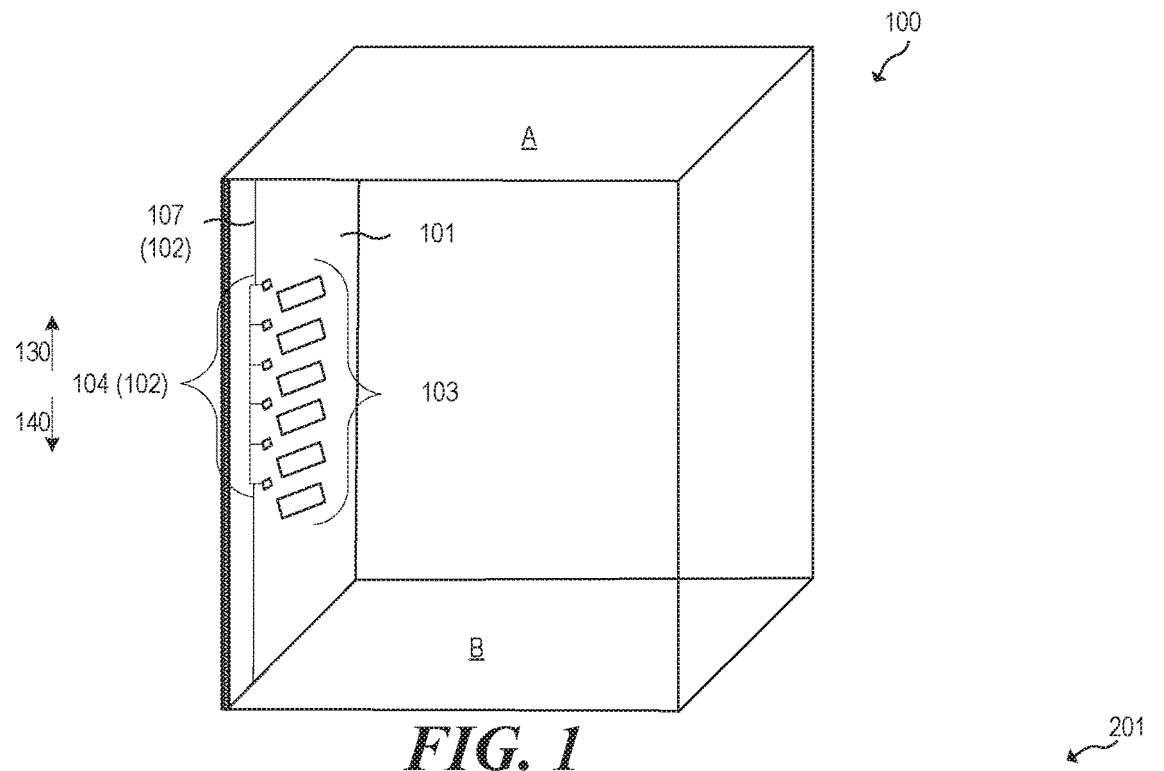
FIG. 1 illustrates a chassis with a backplane having a keying mechanism unit, according to some examples.

In some examples, a chassis may be configured to allow the installation of different backplanes such that one chassis design may support computing devices with different electrical requirements. The backplane that matches the electrical requirements of the planned supported computing devices is installed during manufacturing and the features on the backplane prevent incompatible computing devices from being connected to the backplane and used in the chassis.

However, these examples do not provide dynamic adaptability for the chassis. A chassis in a data center environment may need to be adaptable to specific situations dynamically (e.g., while in use in the data center). A chassis may start off housing a specific type of computing device, but may end up housing another type of computing device as the chassis is in use. For example, as processing requirements of servers increase, the power requirements of those servers often time increase. In an effort to reduce power distribution losses, those servers may use higher input voltages. Thus, a chassis that initially supports computing devices utilizing lower voltage input (e.g., 12V) may need to support computing devices utilizing higher voltage input (e.g., 48V) as those initial computing devices are updated. A chassis that is dynamically adaptable to situations may be used longer over different updates.

A backplane may be configured such that it may be used with different computing devices depending on the situation. For example, a backplane may have the electrical components (e.g., connectors, printed circuit lines, etc.) to work with computing devices that utilize a lower input voltage and to also work with computing devices that utilize a higher input voltage. These backplanes are adaptable but do not provide a way of ensuring that only compatible computing devices are connected to the backplane at the same time.

Examples described herein address these technical challenges by providing a keying mechanism unit for a backplane. The unit allows the backplane to be dynamically adjustable while also ensuring the compatibility of the connected computing devices. In some examples, the backplane may have a plurality of connectors. Each connector may have its own keying block. The keying blocks are linked to each other such that the movement of one keying block in one direction moves the other keying block in the same direction. The keying blocks are positioned on the backplane relative to the connectors such that in a relaxed state, the keying blocks allow either a first type of computing device or a second type of computing device to be inserted into the connector. Upon insertion of one type of computing device into one of the connectors, the keying blocks move such that the other (free) connectors are allowed to connect with computing devices that are compatible with the first type of computing device. The free connectors are prohibited (blocked) from connecting with computing devices that are incompatible with the first type of computing device. Accordingly, examples disclosed herein provide a way of preventing damage to computing devices due to electronic incompatibility in a dynamically adjustable backplane.

Referring now to the figures, FIG. 1 illustrates a side view of a chassis 100 for a computing device enclosure. Chassis 100 may house at least one computing device (not shown) that is inserted into chassis 100. Non-limiting examples of a computing device include a server, a networking device (e.g., switch, patch panel, etc.), workstation, a storage device, a memory device, a media converter (e.g., optical transceiver, etc.), a power source, a cooling mechanism (e.g., fan, etc.), a management module, or any other device with a processing resource. Chassis 100 comprises a backplane 101 that allows the computing devices to electrically connect to each other and to the chassis 100.

Backplane 101 may include a plurality of connectors 103. The plurality of connectors 103 are electronic connectors that allow electrical connection between the inserted computing devices. Backplane 101 may be electrically configured (e.g., via printed circuits on a board, wire-wrapped, etc.) such that the connectors 103 allow an inserted computing device to draw power from a common electrical source provided to chassis 100 and/or communicate with other inserted computing devices. A computing device may be electrically connected via a physical mating of one of the plurality of connectors 103 to a corresponding electrical connector on the computing device.

The plurality of connectors 103 may comprise pins to allow connection and may be shaped and sized such that they are capable of physically mating with corresponding electrical connectors of different types of computing devices. In some examples, the different types of computing devices may be incompatible with each other. As used herein, two computing devices are incompatible with each other when they cannot functionally operate if both devices are connected into the same backplane at the same time. The source of incompatibility may be power based, hardware based, software based, vendor/supplier based, protocol based (e.g., hardware and software combined), etc. For example, the plurality of connectors 103 may physically mate with a corresponding connector on a first type of computing device that utilizes 12V input and may also physically mate with a corresponding connector on a second type of computing device that utilizes 48V input. In this example, the incompatibility between the first type and the second type of computing device is power based. Chassis 100 cannot support both types of computing devices at the same time. In another example, the plurality of connectors 103 may physically mate with a corresponding connector on a first type of computing device that utilizes a specific I/O fabric and may also physically mate with a corresponding connector on a second type of computing device that utilizes a different, specific I/O fabric. In this example, the incompatibility is hardware based as electrically connecting one type into the backplane will cause the other one to be inoperative.

Because the plurality of connectors 103 may physically mate with corresponding connectors of different types of computing devices, chassis 100 is flexible and dynamically adaptable. For example, chassis 100 may support 12V computing devices at one time and then may support 48V computing devices at another time. The dynamic adaptability does not require a manufacturing change in backplane 101 or chassis 100. Due to this flexibility, backplane 101 also includes a keying mechanism unit 102 to help ensure that the computing devices inserted into chassis 100 are compatible with one another. Keying mechanism unit 102 may include a plurality of keying blocks 104, a linking mechanism 107, and spring elements (not shown in FIG. 1).

The number of keying blocks in the plurality of keying blocks 104 is equal to the number of connectors in the plurality of connectors 103 such that each connector in the plurality of connectors 103 has its own corresponding keying block. For example, FIG. 1 illustrates 5 connectors in the plurality of connectors 103. According, there are 5 keying blocks in the plurality of keying blocks 104, one keying block for each connector.

Each keying block in the plurality of keying block is connected to backplane 101 such that each keying block is moveable on backplane 101 relative to its corresponding connector. For example, in FIG. 1, the plurality of keying blocks 104 are moveable in the directions indicated by arrows 130 and 140 from the position shown in FIG. 1. In some examples, backplane 101 may comprise a channel for each keying block. The channels may be recessed in backplane 101 or protrude from backplane 101. Each channel acts as a guide for its respective keying block. The keying block may slide in those channels due to an interaction between the keying block and the channel that provides for limited friction (e.g., a ball bearing). The channel allows for each keying block to move vertically (e.g., in direction 130 or direction 140 without being displaced in another direction).

The plurality of keying blocks 104 are connected to each other via a linking mechanism 107. In some examples, linking mechanism 107 is comprised of a metal and/or plastic rod. Linking mechanism 107 connects the plurality of keying blocks 104 such that the plurality of keying blocks 104 move as one unit. In other words, when one keying block out of the plurality of keying blocks 104 move in direction 140 for a specific distance, the other keying blocks in the plurality of keying blocks 104 also move in direction 140 for the same specific distance.

Figure 3A:
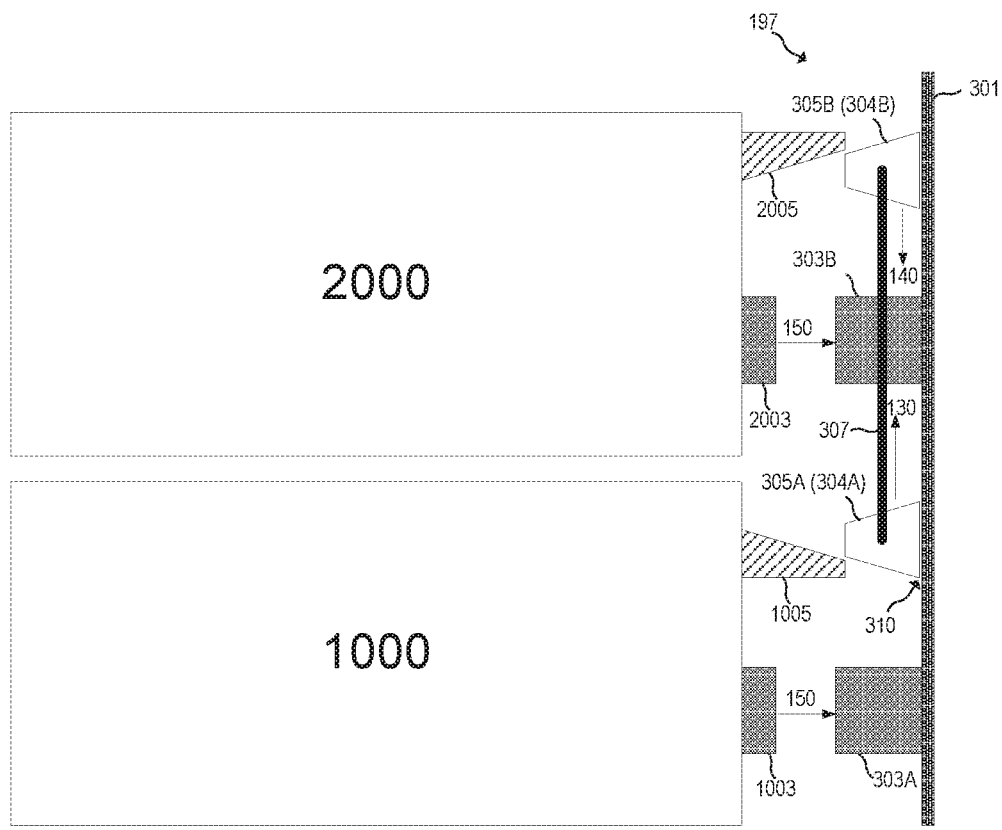
FIG. 3A illustrates a side view of a backplane with computing devices interacting with the backplane, according to some examples.
Figure 3B:
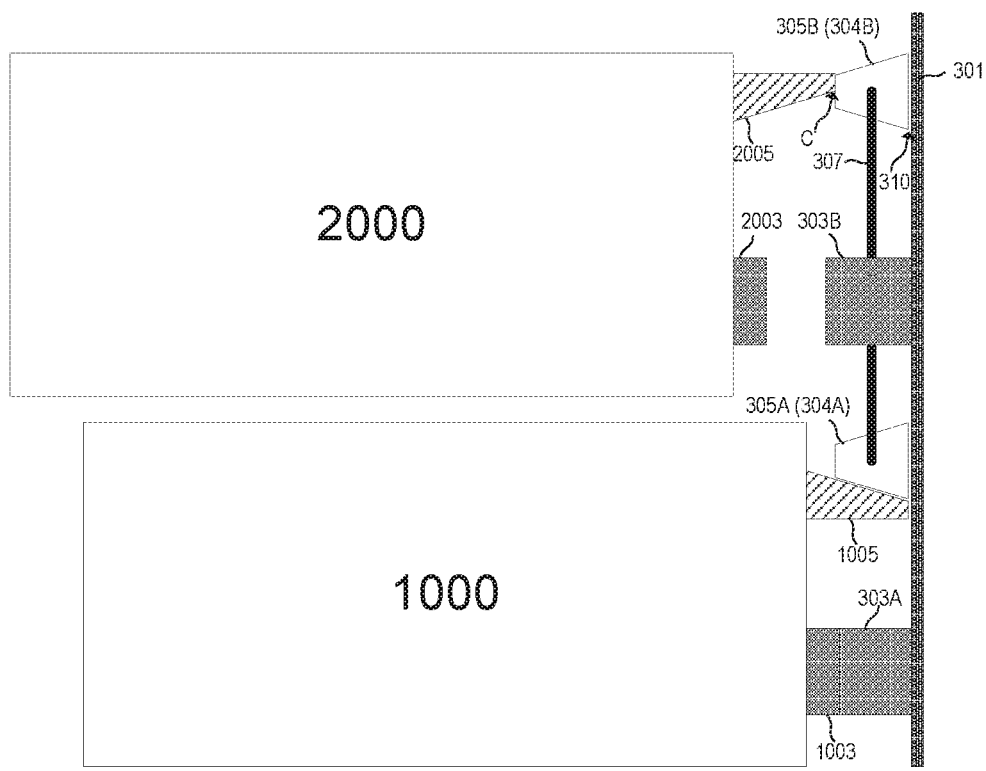
FIG. 3B illustrates the backplane of FIG. 3A with a first type of computing device connected, according to some examples.
Figure 3C:
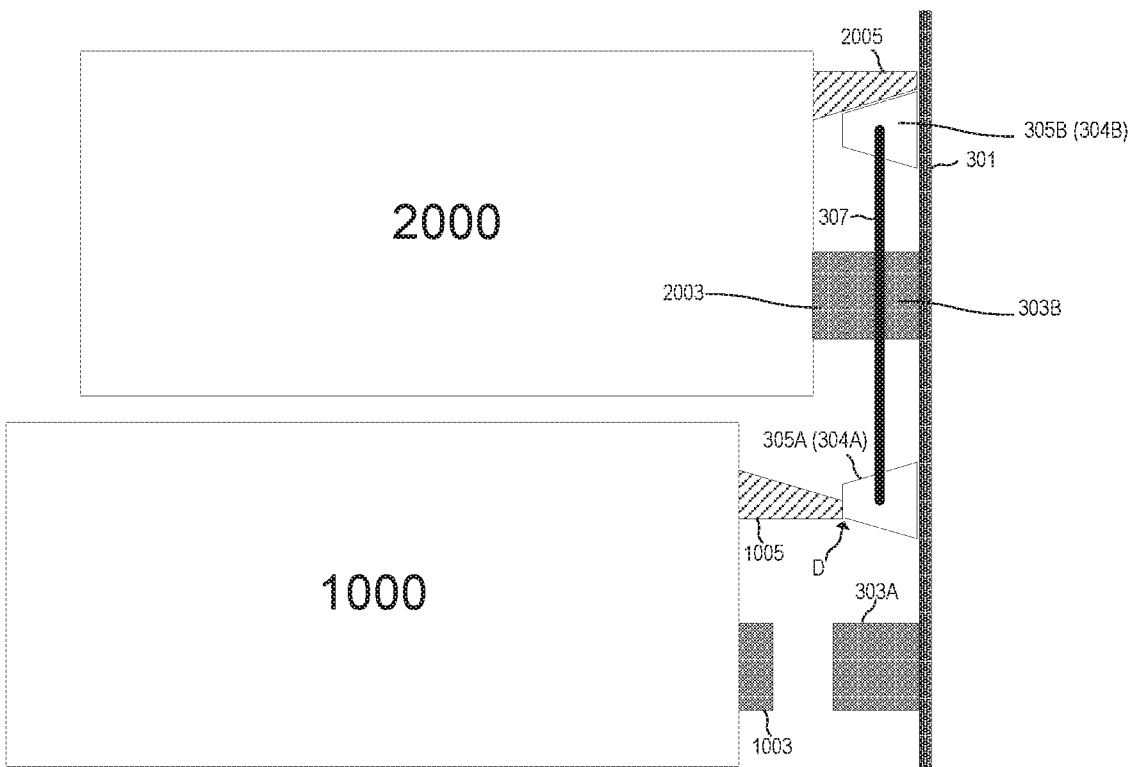
FIG. 3C illustrates the backplane of FIG. 3A with a second type of computing device connected, according to some examples.

In some examples, the plurality of keying blocks 104 do not directly attach (i.e. a surface of the keying block touches a surface of the backplane) to the face of the backplane 101. Rather, the plurality of keying blocks 104 are supported by linking mechanism 107 such that the plurality of keying blocks 104 "float" a distance away from the front face of the backplane 101. The distance allows the plurality of keying blocks 104 to move in relation to the plurality of connectors 103 without rubbing backplane 101. This is shown in FIGS. 3A-3C. In these examples, linking mechanism 307 may be directly attached to backplane 101. For example, backplane 101 may have a horizontal shelf (i.e. perpendicular to the direction of arrows 140 and 130, not shown in FIG. 1) that allows for the anchoring of linking mechanism 170. In some examples, linking mechanism 170 may be welded to the shelf. In other examples, linking mechanism 170 may be directly attached to chassis 100. For example, as seen in FIG. 1, linking mechanism 170 is directly attached to the bottom floor B of chassis 100 and top roof A of chassis 100. In some examples, linking mechanism 107 may be comprised of two portions, a stationary portion that is statically attached to backplane 101 and a moving portion that moves when one of the keying blocks one. The stationary portion may act as a guide or a channel for the moving portion to slide in. The stationary portion may be directly attached to the backplane 101. The moving portion may slide within the stationary portion due to an interaction between the two portions that allows for easy movement (e.g. ball-bearing, etc.) The stationary portion may be attached to the backplane and/or chassis via attachment mechanisms such as screws, etc.

Movement of the plurality of keying blocks 104 may be caused by an insertion of a computing device into chassis 100 and a connection of the computing device to backplane 101. For example, each of the plurality of keying blocks 104 may include a keying feature on the face of the keying block that physically contacts a complementary keying feature on the computing device upon a mating of the connectors. As used herein, two features are complementary when the interaction of the features cause one of the two features to move. For example, the keying feature on the keying block may be shaped such that on physical contact with the complementary keying feature on the computing device, the keying block moves in the direction of 140 or in the direction of 130. The movement of the plurality of keying blocks in the direction of 140 allows for a first type of computing device to connect to backplane 101 via any one of the connectors in the plurality of connectors 103 but prohibits the connection of a second type of computing device to backplane 101. Similarly, the movement of the plurality of keying blocks in the direction of 130 allows for the second type of computing device to connect to backplane 101 via any one of the connectors in the plurality of connectors 103 but prohibits the connection of a first type of computing device to backplane 101. This is described in relation to FIGS. 3A-3C.

Thus, with chassis 100, the physical mating of one connector out of the plurality of connectors 103 to a first type of computing device moves the plurality of keying blocks such that the remainder of the connectors out of the plurality of connectors 103 are allowed to connect with computing devices that are compatible with the already connected computing device. Computing devices that are incompatible with the already connected computing device are blocked from being connected due to the position of the keying blocks 104. Keying mechanism unit 102 may also include a spring mechanism that biases the keying mechanism 102 to the position shown in FIG. 1. For example, if the insertion of a computing device moves the keying mechanism unit in the direction of 140, the spring mechanism may allow the keying mechanism unit to move back to a relaxed state upon removal of the computing device. This is described in relation to FIGS. 2A-2C. In these examples, the spring element may be directly attached to the linking mechanism 107 on one end and directly attached to the chassis 100 and/or backplane 101 on the other end.

Figure 2A:
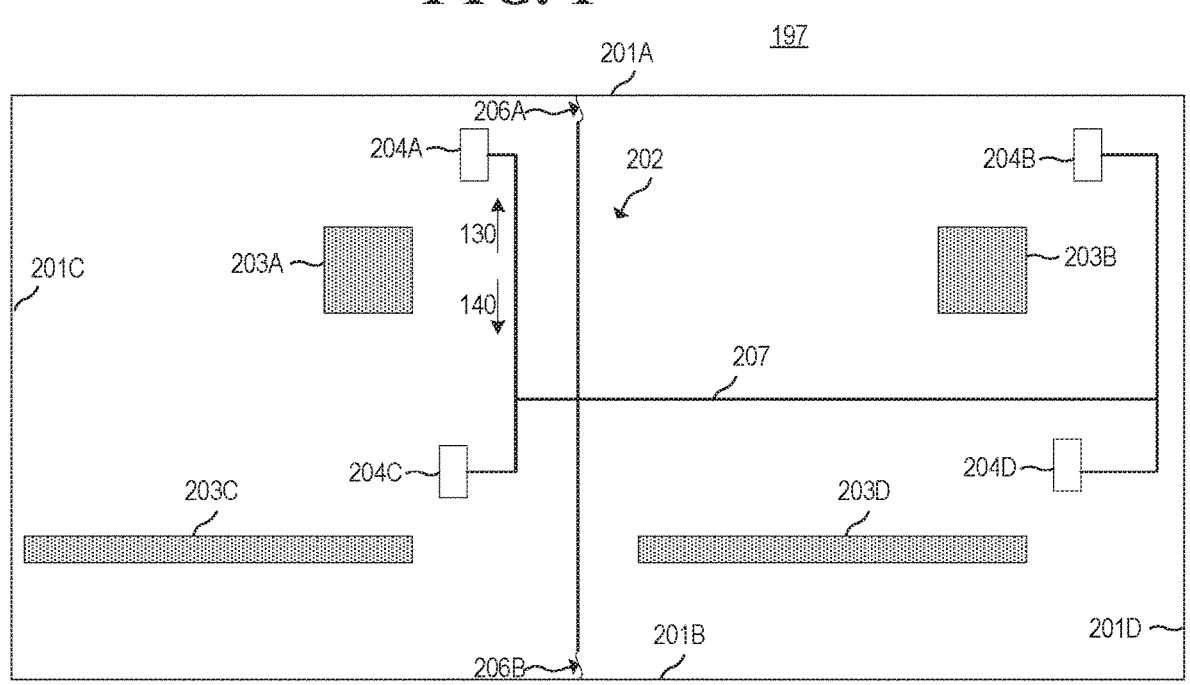
FIG. 2A illustrates a front view of a backplane with a keying mechanism unit in a relaxed state, according to some examples.
Figure 2B:
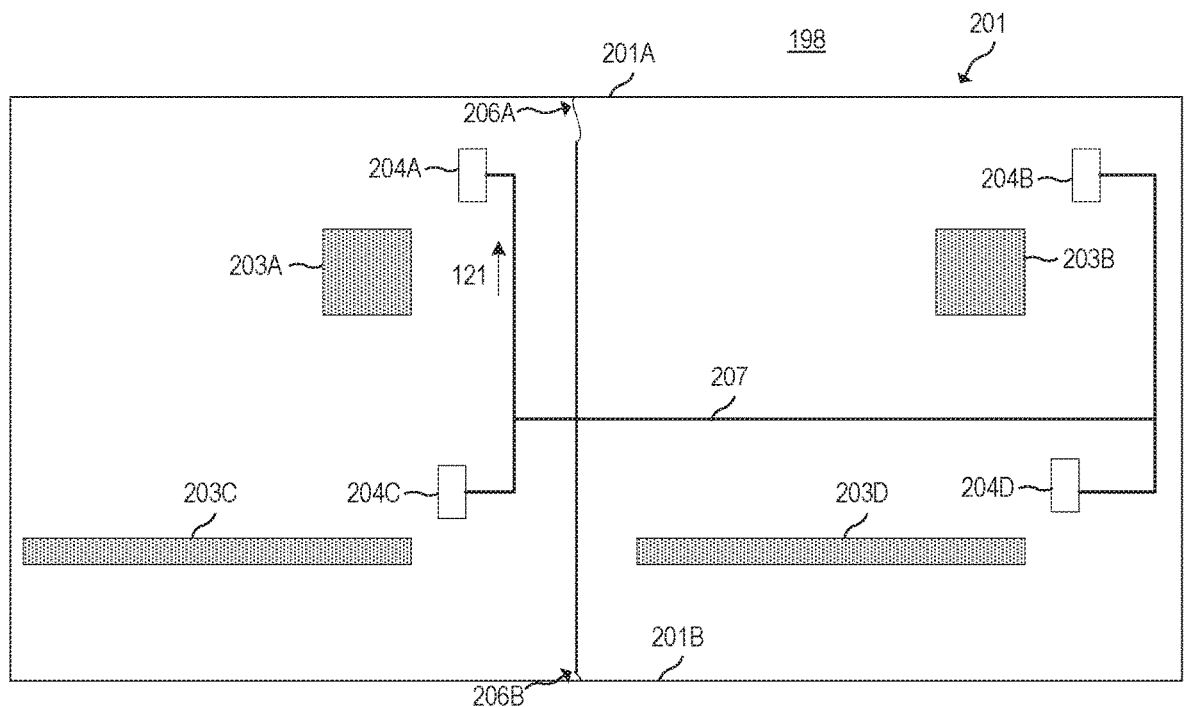
FIG. 2B illustrates the backplane of FIG. 2A in a first state, according to some examples.
Figure 2C:
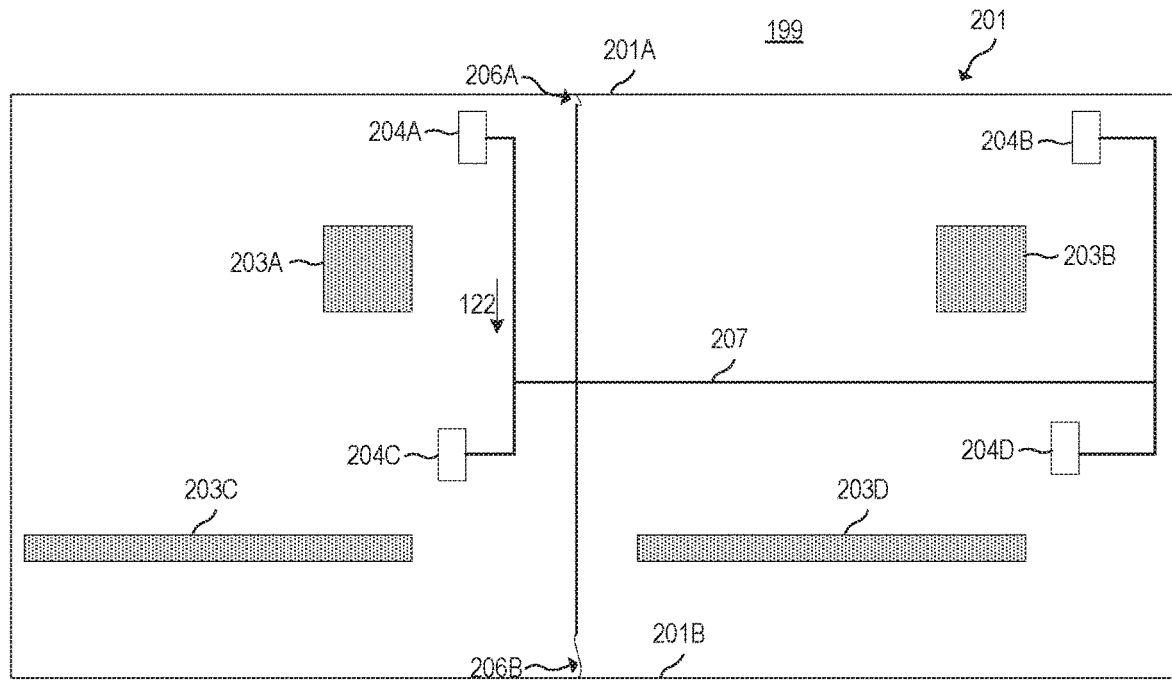
FIG. 2C illustrates the backplane of FIG. 2A in a second state, according to some examples.

FIGS. 2A-2C illustrate a front view of a backplane 201 with connectors 203A, 203B, 203C, 203D, and keying mechanism unit 202.

FIG. 2A illustrates the keying mechanism unit 202 in a relaxed state 197. FIG. 2B illustrates the keying mechanism unit 202 in a first state 198. FIG. 2C illustrates the keying mechanism unit 202 in a second state 199.

As seen in FIG. 2A, connectors 203A, 203B, 203C, and 203D may be different types of connectors. For example, connectors 203A and 203B may be connectors that connect to networking devices (e.g., switches) and connectors 203C and 203D may be connectors that connect to a power sources.

Keying mechanism unit 202 includes four keying blocks 204A, 204B, 204C, and 204D, one keying block that corresponds to each connector. Keying mechanism unit 202 also includes linking mechanism 207 and spring elements 206A and 206B. As shown in FIG. 2A, keying mechanism unit 202 (and thus four keying blocks 204A, 204B, 204C, and 204D) is in a relaxed state. In the relaxed state, spring elements 206A and 206B are neutral (i.e. neither extended nor compressed). Additionally, each keying block is positioned relative to the corresponding connector such that the connectors 203A, 203B, 203C, and 203D may physically mate with any computing device that has a corresponding connector. For example, connectors 203A, 203B, 203C, and 203D are sized and shaped to match with a variety of computing devices.

In the relaxed state 197, the keying blocks 204A, 204B, 204C, and 204D do not block the connectors 203A, 203B, 203C, and 203D from connecting with any corresponding connectors of computing devices. Keying mechanism unit 202 (and thus four keying blocks 204A, 204B, 204C, and 204D) may be moved from the relaxed state 197 in the direction of arrow 130 or in the direction of arrow 140. For example, if a first type of computing device (e.g., a 12V power source) is connected to connector 203C, the motion of inserting and connecting the power source may move keying block 204C from the relaxed state 197 in the direction of 140. This is because a keying feature on keying block 204C may physically interact with a keying feature on the power source. Because keying block 204C is directly attached to linking mechanism 207, linking mechanism will also move when keying block 204C moves. Additionally, because keying blocks 204A, 204B, and 204D are all directly attached to linking mechanism 207, keying blocks 204A, 204B, and 204D will also move when linking mechanism 207 moves. Accordingly, the components of keying mechanism unit 202 will move as one unit.

The movement of linking mechanism 207 will also cause spring elements 206A and 206B to move. Specifically, when keying mechanism unit 202 moves in the direction of 140 (e.g., characterized as a first state), spring element 206A will extend from its original length shown in FIG. 2A to the length shown in FIG. 2B in the direction of 140. Additionally, spring element 206B will compress from its original length shown in FIG. 2A to the length shown FIG. 2B in the direction of 140. Due to a spring constant for spring element 206A, spring element 206A will want to move back to its original length (from extension), but it cannot because of the interaction between keying block 204C and a complementary feature on the power source. Similarly, due to a spring constant $k_2$ for spring element 206B, spring element 206B will want to move back to its original length (from compression), but it cannot. Spring elements 206A and 206B may include a coil-spring, a leaf spring, etc.

Spring element 206A may be directly attached to a horizontal surface 201A of backplane 201 and spring element 206B may be directly attached to a horizontal surface 201B of backplane 201. This allows spring elements 206A and 206B for a static anchor point, allowing spring elements 206A and 206B to bias the linking mechanism 207 back to neutral position 197. Additionally, as discussed in relation to FIG. 1, linking mechanism 207 is directly attached to spring elements 206B and 206A. This allows linking mechanism 207 to support keying blocks 204A, 204B, 204C, and 204D such that keying blocks 204A, 204B, 204C, and 204D do not move unless there is a force encountered that is stronger than the constant force k of the spring elements 206A and 206B. Accordingly, spring elements 206A and 206B may have respective spring constant $k_1$ and $k_2$ that are resistant to movements typically felt by an enclosure in a data center that are unrelated to the connection and disconnection of computing devices into the backplane (e.g., movements due to chassis location change in the data center, etc.).

FIG. 2B illustrates the keying mechanism unit in the first state (i.e. moved from the relaxed state 197 in the direction of 140 of FIG. 1.) Keying blocks 204A, 204B, 204C, and 204D have moved relative to their positions shown in FIG. 2A. Similarly, linking mechanism 207 has also moved relative to its position shown in FIG. 2A. Spring element 206A is extended and spring element 206B is compressed. Connectors 203A, 203B, 203C, and 203D do not move and stay static on backplane 201. The movement of keying blocks 204A, 204B, 204C, and 204D to the first state is caused by the connection of a specific power source to connector 203C. In this first state 198, keying blocks 204A, 204B, and 204D allow computing devices that are compatible with the specific power source to be connected to connectors 203A, 203B, and 203D (e.g., computing devices that utilize 12V). However, keying blocks 204A, 204B, and 204D prohibit connectors 203A, 203B, and 203D to connect with computing devices that are incompatible with the specific power source already connected to connector 203C (e.g., computing devices that utilize voltage inputs higher than 12V, etc. 48V).

When the specific power source is disconnected from connector 203C, the biases of spring elements 206A and 206B cause the linking mechanism 207 to move in the direction indicated by arrow 121 in FIG. 2B. This moves the keying blocks 204A, 204B, 204C, and 204D back to the relaxed state in FIG. 2A.

Referring back to FIG. 2A, keying blocks 204A, 204B, 204C, and 204D no longer block the connectors 203A, 203B, 203C, and 203D from connecting. Thus, connectors 203A, 203B, 203C, and 203D are again allowed to connect to any connectors on a computing device that is capable of physically mating to connectors 203A, 203B, 203C, and 203D. Accordingly, another computing device may be connected to backplane 201 via connector 203B. This computing device may operate with a power input of 48V. Upon insertion of this computing device and the connection of a corresponding connector on this computing device to connector 203B, keying mechanism unit 202 (and thus keying blocks 204A, 204B, 204C, and 204D) are moved from the relaxed state 197 in the direction of arrow 130. Specifically, the motion of inserting and connecting the computing device moves keying block 204B from the relaxed state 197 in the direction of 130. Because keying block 204B is directly attached to linking mechanism 207, linking mechanism 207 will also move when keying block 204B moves. Additionally, because keying blocks 204A, 204C, and 204D are all directly attached to linking mechanism 207, keying blocks 204A, 204C, and 204D will also move when linking mechanism 207 moves. Accordingly, the components of keying mechanism unit 202 will move as one unit in the direction of arrow 130.

The movement of linking mechanism 207 will also cause spring elements 206A and 206B to move. Specifically, when keying mechanism unit 202 moves in the direction of 130 (e.g., characterized as a second state), spring element 206A compresses from its original length shown in FIG. 2A to the length shown in FIG. 2C in the direction of 130 and spring element 206B extends from its original length shown in FIG. 2A to the length shown FIG. 2C in the direction of 130. Due to its spring constant, spring element 206A will want to move back to its original length (from compression), but it cannot because of the interaction between keying block 204B and a complementary feature on the inserted computing device. Similarly, due to its spring constant, spring element 206B will want to move back to its original length (from extension), but it cannot.

FIG. 2C illustrates the keying mechanism unit in the second state (i.e. moved from the relaxed state 197 in the direction of 130 of FIG. 1.) Keying blocks 204A, 204B, 204C, and 204D have moved relative to their positions shown in FIG. 2A. Similarly, linking mechanism 207 has also moved relative to its position shown in FIG. 2A. Spring element 206A is compressed and spring element 206B is extended. Connectors 203A, 203B, 203C, and 203D do not move and stay static on backplane 201. The movement of the keying blocks to the second state is caused by the connection of a specific computing device to connector 203B. In this second state 199, keying blocks 204A, 204C, and 204D allow computing devices that are compatible with the specific computing device to be connected to connectors 203A, 203C, and 203D. However, keying blocks 204A, 204C, and 204D prohibit connectors 203A, 203C, and 203D to connect with computing devices that are incompatible with the specific computing device already connected to connector 203B.

When the specific computing device is disconnected from connector 203B, the biases of spring elements 206A and 206B cause linking mechanism 207 to move in the direction indicated by arrow 122. Accordingly, the keying blocks 204A, 204B, 204C, and 204D move back to the relaxed state in FIG. 2A.

FIGS. 3A-3C illustrate a side view of a backplane 301 interacting with computing device 1000 and computing device 2000. Computing device 1000 may be characterized as a first type of computing device and computing device 2000 may be characterized as a second type of computing device. The first type of computing devices and the second type of computing devices are incompatible.

Backplane 301 comprises a first connector 303A, a second connector 303B, a first keying block 304A, a second keying block 304B, and a linking mechanism 307. First keying block 304A corresponds to first connector 303A and second keying block 304B corresponds to second connector 303B. Accordingly, first keying block 304A is located in a position relative to first connector 303A such that it may allow first connector 303A to connect to a corresponding connector on a computing device or prohibit first connector 303A from connecting to the corresponding connector, depending on the position the keying block 304A is in. Similarly, second keying block 304B is located in a position relative to second connector 303B such that it may allow or block second connector 303E from connecting to a corresponding connector on a computing device, depending on the position the keying block 304B is in.

As shown in FIGS. 3A-3C, first connector 303A and second connector 303B are directly attached to backplane 301 while first keying block 304A and second keying block 304B are not directly attached to backplane 301. Rather, first keying block 304A and second keying block 304B are located a distance 310 away from the surface of backplane 301. Distance 310 is big enough such that first keying block 304A and second keying block 304B may move on backplane 301 relative to their corresponding connectors 303A and 303B but small enough such that the first keying block 304A and second keying block 304B are not obstacles to any connections. As discussed above in relation to FIG. 1, keying blocks 304A and 304B may be kept in place on backplane 301 by linking mechanism 307. For example, keying blocks 304A and 304B may be directly attached to linking mechanism 307 and linking mechanism 307 may be directly attached to spring elements (not shown in FIGS. 3A-3C). The spring elements may be directly attached to a surface that is perpendicular to the direction of movement of the keying blocks. In the example of FIGS. 3A-3C, the direction 140 and direction 130 may be characterized as vertical, so the surface of attachment may be a horizontal surface (e.g., of backplane 301 or a chassis that backplane 301 is used in) This allows an anchor point for linking mechanism 307.

As shown in FIGS. 3A-3C, first keying block 304A may include features that allow it to be moved vertically (i.e. parallel to backplane 301 in direction 130 or direction 140, as shown in FIG. 3A) in response to a horizontal force. For example, as shown in FIG. 3A, first keying block 304A may have a keying feature 305A. Keying feature 305A may be comprised of two slanted surfaces connected by a flat surface such that keying block 304A comprises a trapezoidal shape. The two slanted surfaces may interact with a slanted surface of a keying feature on a computing device. Similarly, second keying block 304B may also comprise a similar keying feature 305B as first keying block 304A.

For example, upon horizontal insertion of computing device 1000 in direction 150 such that connector 1003 may connect to connector 303A, a slanted surface of keying feature 1005 may interact with a complementary slanted surface of keying feature 305A on keying block 304A such that keying block 304A moves in direction 130. With movement of first keying block 304A in the direction of 130, second keying block 304B also moves in the direction of 130. Accordingly, first keying block 304A and second keying block 304B move to a first state as shown in FIG. 38. In the first state, computing device 1000 is connected to backplane 301 via interaction of connector 1003 and first connector 303A and thus, first keying block 304A allows for the connection of computing device 1000 (a first type of computing device). Additionally, second keying block 304B also allows for connector 303B to connect to a first type of computing device. However, second keying block 304B prohibits connector 303B to connect to computing device 2000 (a second type of computing device). Specifically, the flat portion of keying feature 305B of second keying block 304B abuts a flat surface of keying feature 2005 on second computing device 2000 at point C and stops computing device 2000 from being inserted far enough for connectors 2003 and 303B to physically mate. Thus, connector 303B is allowed to connect to computing devices that are compatible with computing device 1000 (which is already inserted).

Referring back to FIG. 3A, in examples where computing device 2000 is connected via second connector 303B before the connection of computing device 1000, keying block 304A would prevent computing device 2000 to be connected after. Specifically, upon horizontal insertion of computing device 2000 in direction 150 to connect with connector 303B, a slanted surface of keying feature 2005 on computing device 2000 interacts with a slanted surface of keying feature 305B. Due to this interaction, second keying block 304B moves in the direction 140. Because second keying block 304B is linked to first keying block 304A by linking mechanism 307, first keying block 304A also moves in direction 140 to second state as shown in FIG. 3C.

In this second state, computing device 2000 is connected to backplane 301 via interaction of connector 2003 and second connector 303B and thus, second keying block 304B allows for the connection of computing device 2000 (a second type of computing device). Additionally, first keying block 304A also allows for first connector 303A to connect to a second type of computing device (that is compatible with second computing device 2000). However, first keying block 304A prohibits first connector 303A to connect to computing device 1000 (a first type of computing device). Specifically, the flat portion of keying feature 305A of first keying block 304A abuts a flat surface of keying feature 1005 on first computing device 1000 at point D and stops first computing device 1000 from being inserted far enough for connectors 1003 and 303A to physically mate. Thus, connector 303A is allowed to connect to computing devices that are compatible with computing device 2000 (which is already inserted) but prohibited from connecting with computing devices that are incompatible with computing device 2000.

In the relaxed state, as shown in FIG. 3A, first connector 303A and second connector 303B may connect to any connectors of first computing device 1000 or second computing device 1000. However, upon connection a specific type of computing device with either first connector 303A or second connector 303B, keying blocks 304A and 304B move (based on the interaction of the keying features) to either a first state or a second state. In the first state, only computing device 1000 and computing devices compatible with computing device 1000 may be connected to connector 303A and/or connector 303B. In the second state, only computing device 2000 and computing devices compatible with the computing device 2000 may be connected to connector 303B and/or connector 303A. Accordingly, the keying blocks 304A and 304B allow help to ensure that computing devices connected into a backplane are compatible with each other.

While the figures show a specific number of connectors and keying blocks, examples described herein are not limited to the specific number shown. For example, a keying mechanism unit may have at least two (e.g., 2, 5, 10, 15, etc.) connectors and at least two (e.g., 2, 5, 10, 15, etc.) keying blocks, one keying block for each connector. Additionally, while the figures show keying mechanism units in specific orientations and with specific directional movements with respect to the backplane, other orientations and movements are included. For example, in the example of FIGS. 2A-2C, spring elements 206A and 206B are positioned such that keying blocks 204A, 204B, 204C, and 204D translate vertically (e.g., in the direction 130 and/or direction 140) when a computing device is connected. However, in other examples, spring elements 206A and 206B may be positioned such that keying blocks 204A, 204B, 204C, and 204D translate horizontally (towards 201C or towards 201D in FIG. 2A). For example, spring element 206A may be directly attached to a vertical shelf 201C of backplane 201 and spring element 206B may be directly attached to a vertical shelf 201D of backplane 201. Additionally, the keying features on keying blocks 204A, 204B, 204C, and 204D may be shaped such that a horizontal insertion of a computing device results in a horizontal movement of the keying blocks.

While the figures illustrate specific mechanical links and mechanisms to generate the movement of the keying blocks, other mechanisms (e.g., electrical, electro-mechanical, etc.) may be used as well. For example, FIGS. 2A-2C illustrate the usage of spring elements 206A and 206B to bias the keying mechanism unit to a relaxed position. However, in some embodiments, instead of spring elements, hydraulic pistons may bias the keying mechanism unit back to the relaxed state. In these examples, the hydraulic pistons may resist movement away from the relaxed state. Accordingly, the resistive force provided by the hydraulic pistons should be less than the force that is transferred to the linking mechanism when it is moved upon connection of a computing device. As another example, stepper motors may be used to move the keying blocks. For example, each keying block may have its own stepper motor which are linked by digital communication. When one keying block is moved from its relaxed state (to either a first state or a second state via a connection of a computing device), the stepper motors of other keying blocks receive an electrical command to imitate the position of the first keying block. Accordingly, in this example, the keying blocks still move as one unit to the first state or the second state but the linking mechanism may not be present. The stepped motors may periodically try to go back to the relaxed state and will be able to when a computing device is not connected. Once one keying block returns back to the relaxed state, the other stepper motors may receive a command to move back to the relaxed state as well.

All of the features disclosed in this specification (including any accompanying claims, abstract and drawings), and/or all of the elements of any method or process so disclosed, may be combined in any combination, except combinations where at least some of such features and/or elements are mutually exclusive.

What is claimed is:

1. A chassis comprising:
   a backplane;
   a plurality of first connectors in the backplane;
   a plurality of second connectors in the backplane;
   a first block for the plurality of first connectors;
   a second block for the plurality of second connectors;
   wherein the first block and the second block are moveable as a unit on the backplane to a first state or a second state, based on installation of different types of devices;
   wherein, when no device is connected to the either the first connectors or second connectors, the first block and second block are in a relaxed state and allow the first connectors to connect to a first type of device and the second connectors to connect to a second type of device;
   wherein, when the first type of device is connected to any of the first connectors and the first block and second block are in a relaxed state, the first block and second block moves to the first state and in the first state the first block allows the first connectors to connect to the first type of device; and
   wherein, when the second type of device is connected to any of the second connectors and the first block and second block are in a relaxed state, the first block and second block moves to the second state and in the second state the second block allows the second connectors to connect to the second type of device.

2. The chassis of claim 1, wherein the first type of device operates at a different voltage than the second type of device.

3. The chassis of claim 1, comprising a first spring element; and
a second spring element, wherein the first spring element and the second spring element are moveable as a unit with the first block and the second block.

4. The chassis of claim 3, wherein the first spring element and the second spring element bias the first block and the second block to the first state.

5. A computing device comprising:
a backplane;
a plurality of connectors on the backplane;
a plurality of keying blocks moveable as one unit on the backplane, wherein the plurality of keying blocks are movable based on connections to different types of devices;
   wherein, when a device is not connected to any of the plurality of the connectors, the plurality of keying blocks allow the plurality of connectors to connect to a first type of device and a second type of device;
   wherein, when the first type of device is a first device connected to one of the plurality of connectors, the plurality of keying blocks move to prohibit the plurality of connectors to connect to the second type of device that is incompatible with the first type of device; and
   wherein, when the second type of device is the first device connected to one of the plurality of connectors, the plurality of keying blocks move to prohibit the plurality of connectors to connect to the first type of device that is incompatible with the second type of device.

6. The server of claim 5,
wherein the plurality of keying blocks are moveable to a relaxed state; and
   wherein, in the relaxed state, the plurality of keying blocks allow the plurality of the connectors to connect to the first type of device and to the second type of device.

7. The server of claim 6, comprising a spring element to bias the plurality of keying blocks to the relaxed state.

8. The server of claim 6, wherein the first type of device operates at a different voltage than the second type of device.

9. A backplane comprising:
first connectors;
second connectors;
a first blocking mechanism moveable relative to the first connectors;
a second blocking mechanism moveable relative to the second connectors;
   wherein the first blocking mechanism and the second blocking mechanism are moveable as one unit from a relaxed state to a first state or second state;
   wherein, in the relaxed state, the first connectors and the second connectors are connectable to a first type of device and a second type of device, respectively;
   wherein, in the first state, the first connectors are connectable to the first type of device, and the second blocking mechanism moves to block the second connectors from connecting to the second type of device; and
   wherein, in the second state, the second connectors are connectable to the second type of device, and the first blocking mechanism moves to block the first connectors from connecting to the first type of device.

10. The backplane of claim 9, wherein the first type of device is incompatible with the second type of device.

11. The backplane of claim 9, comprising a spring element to bias the first blocking mechanism to the relaxed state.

12. The backplane of claim 9, wherein the first blocking mechanism is complementary to a keying feature on the first type of device and complementary to a keying feature on the second type of device.

13. The backplane of claim 12, wherein the first blocking mechanism moves from the relaxed state to the first state via an interaction of the keying feature on the first type of device and the first blocking mechanism.

* * * * *